United States Patent [19]

Nishida et al.

[11] 4,226,208

[45] Oct. 7, 1980

[54] VAPOR DEPOSITION APPARATUS

[75] Inventors: Keijiro Nishida, Nimomiya; Mitsuo Kakei, Tokyo; Osamu Kamiya; Nobuyuki Sekimura, both of Yokohama, all of Japan

[73] Assignee: Canon Kabushiki Kaisha, Tokyo, Japan

[21] Appl. No.: 928,435

[22] Filed: Jul. 27, 1978

[30] Foreign Application Priority Data

Aug. 4, 1977 [JP] Japan .................................. 52-93798
Jun. 1, 1978 [JP] Japan .................................. 53-66160

[51] Int. Cl.² ............................................. C23C 13/08
[52] U.S. Cl. .................................. 118/706; 118/50.1; 118/503; 118/504; 118/719; 118/724; 118/725; 118/730; 118/733
[58] Field of Search ............... 118/706, 719, 724, 725, 118/730, 733, 50.1, 503, 504

[56] References Cited

U.S. PATENT DOCUMENTS 3,981,791 9/1976 Rosvold .............................. 118/49.1

FOREIGN PATENT DOCUMENTS

38-25633 11/1963 Japan .

Primary Examiner—Bernard D. Pianalto
Attorney, Agent, or Firm—Toren, McGeady and Stanger

[57] ABSTRACT

An apparatus for vacuum deposition of a thin film onto the surface of a substrate includes a vacuum container formed by a base plate, a cylindrical side wall and a top plate to accommodate at least four movable sealing caps each having a space adapted to confine a batch of substrates on a carrier of dome shape. The caps move around the center of the base plate. When the caps are stopped to cover respective openings provided through the base plate, there are established a pre-heating, a vapor depositing, a cooling and an air locking chamber, and the batch of processed substrates in the air locking chamber is moved to the outside of the apparatus without disturbing the vacuum in the container. Next, the air locking chamber, after having received a new batch of unprocessed substrates at the space of the cap thereof, is sealed from the ambient atmosphere, and all the caps are advanced one step ahead. The controlled atmosphere in the lower section of the vapor depositing chamber remains almost unchanged during this time to insure that uniform, thin-film layers of deposited material are applied to the substrates. Further, to eliminate fluctuation in quality among manufactured lots, there is provided a novel evaporant feeding mechanism.

15 Claims, 13 Drawing Figures

VAPOR DEPOSITION APPARATUS

BACKGROUND OF THE INVENTION

This invention relates to an apparatus for depositing a thin-film layer upon an optical or electric circuit element or magnetic substrate, and more particularly to improvements of such apparatus with respect to uniform film characteristics.

Figure 1:
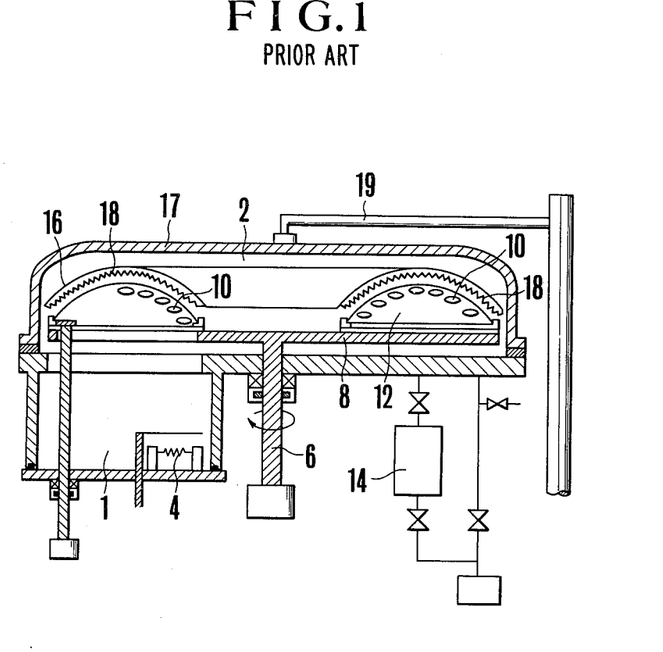
FIG. 1 is a sectional view of a vapor deposition apparatus of the turret type according to the prior art.

It is known to provide a vapor deposition apparatus capable of processing a number of batches of substrates continuously at one cycle of bell jar operation in a turret form, as, for example, disclosed in Japanese Utility Model No. Sho 38-25633 issued Nov. 27, 1963. In FIG. 1, a sectional view of this apparatus appears. The apparatus includes a vapor depositing chamber 1 mounted on the under surface of a round base and communicating the interior 2 of an enclosure 17, in the form of a bell jar, through an opening which is provided through the wall of the base. A shaft 6 which protrudes through the base at the center of the area thereof rotatably supports a turret 8 on which a number of batches of substrates 10 in carriers of dome shape 12 are situated to be coated. After the interior 2 and chamber 1 have been evacuated by a pump 14, each of the batches of substrates 10 is heated to a predetermined temperature by a respective radiant energy heater 18, then advanced one step ahead to lie above the vapor depositing chamber 1, and then an evaporant material is heated by a heater 4 to form an evaporant. After a thin-film layer has been applied on the surface of each of the substrates above the chamber 1, the turret 8 is rotated one step to process the next batch of substrates 10. The completion of coating of all the batches of substrates 10 is followed by a cooling step which is then followed by the opening of the bell jar 17 with the help of an oil hydraulic machine 19 to remove the batches of processed substrates 10 and replace them with a number of new batches of unprocessed substrates. Thus, the turret type vapor depositing apparatus has disadvantages of consuming a long time per one substrate to be processed and of making it difficult to control the properties of the applied thin-film layer produced in different cycles of bell jar operations due to the repeated evacuation and exposure to the ambient atmosphere of the vapor depositing chamber. To avoid these disadvantages, coating apparatus of the in-line type have been proposed in U.S. Pat. Nos. 3,568,632 and 3,656,454 to Cawthon and Schrader respectively in which a coating chamber, evacuated chamber, heating chamber, cooling chamber and vacuum tight chamber are positioned in line, and individually sealed by valve plates so that the chambers have respective atmospheres controlled independently of each other. This arrangement is, however, associated with an alternate disadvantage of increasing the size of the apparatus.

The present invention concerns an apparatus for vacuum deposition of thin-film layers onto the surface of an optical or electric circuit element or magnetic substrate.

A first object of the invention is to provide an apparatus of the character described which avoids or is less vulnerable to the foregoing drawbacks and which requires no larger area of installation than is necessary in the conventional apparatus.

A second object of the invention is to provide an apparatus of the character described capable of continuously processing of batches of substrates through preheating, vapor depositing and cooling chambers with little possibility of impurities entering these chambers from the ambient atmosphere.

A third object of the invention is to provide an apparatus of the character described in which the production of uniform film characteristics in the deposited layers on the substrates is assured.

A fourth object of the invention is to provide a novel evaporant material feeding mechanism assisting in further improvement of the uniformity of film characteristics.

These and other objects, features and advantages of the present invention will become apparent from the following detailed description taken in conjunction with the accompanying drawings.

BRIEF DESCRIPTION OF THE DRAWINGS

FIGS. 9 (a) to (d) are sectional views of a control member for controlling the amount of evaporant material supplied to the transfer member in four different operative positions.

DESCRIPTION OF THE PREFERRED EMBODIMENT

Figure 2:
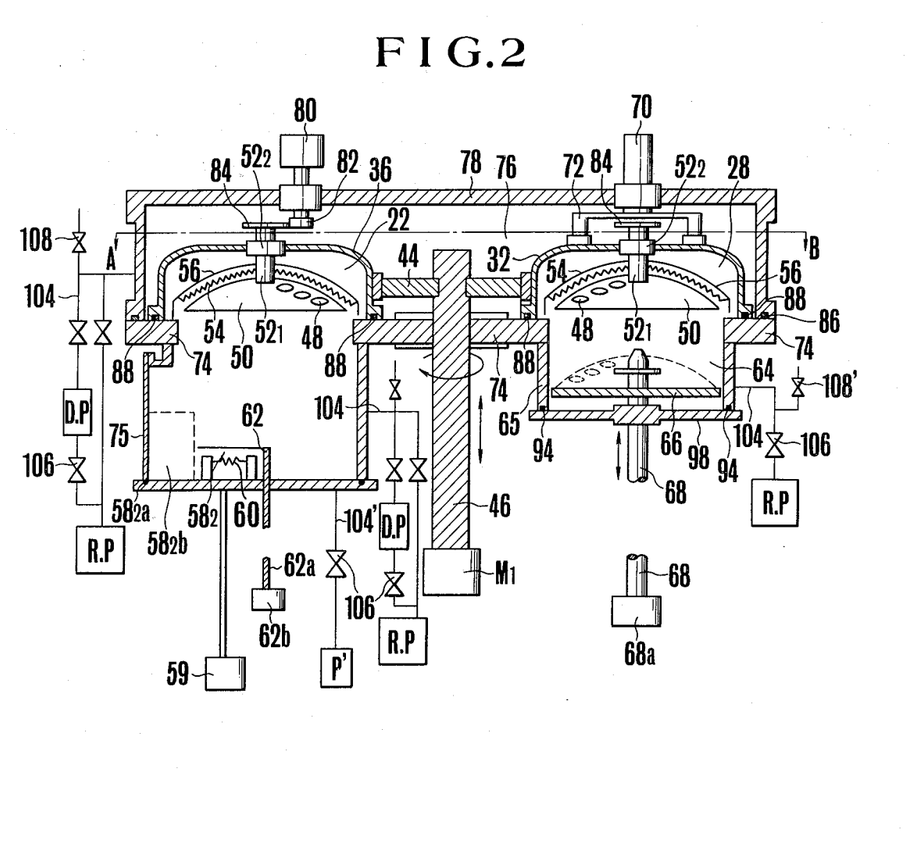
FIG. 2 is a vertical sectional view of one embodiment of a vapor deposition apparatus according to the present invention with particular illustration of constructional features of a vapor depositing chamber and an entrance-and-exit air locking chamber.
Figure 3:
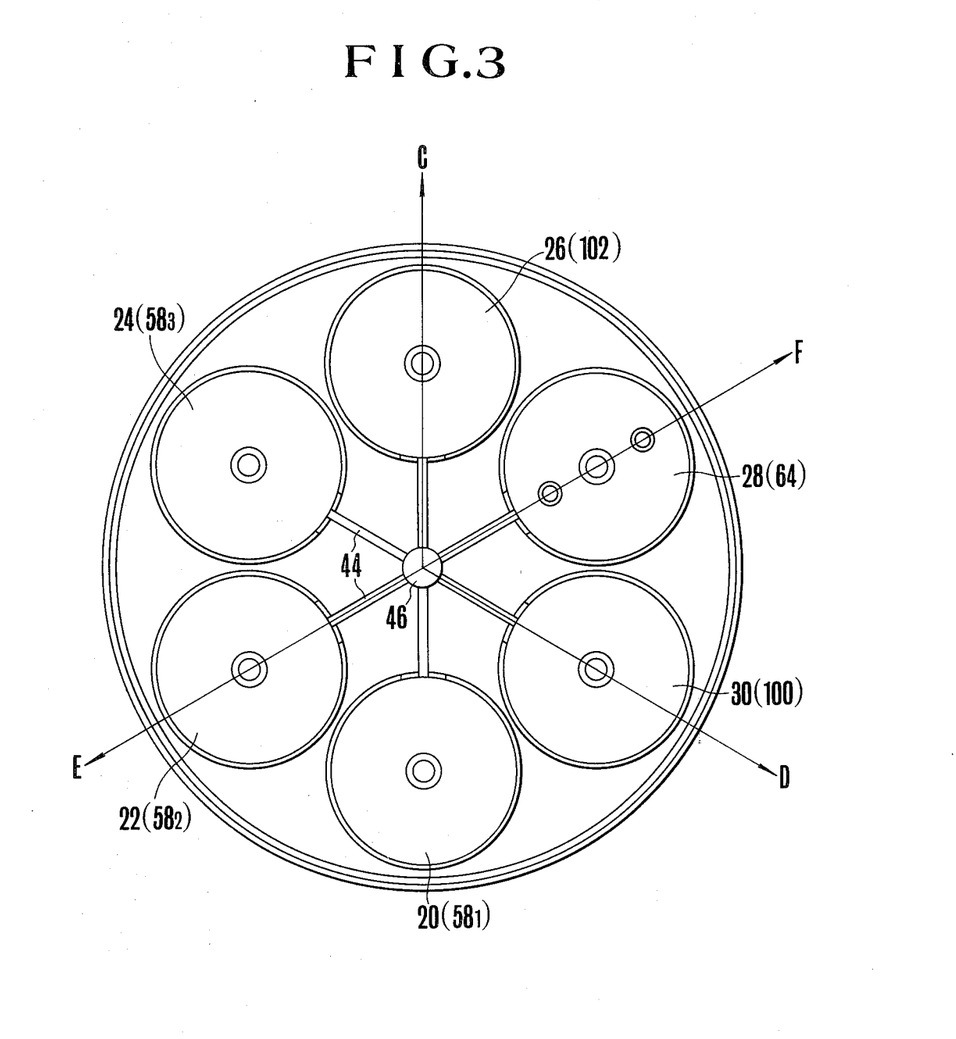
FIG. 3 is a horizontal sectional view taken along the line A-B of FIG. 2 illustrating an arrangement of six sealing devices or bell jars as are placed to establish six chambers.
Figure 4:
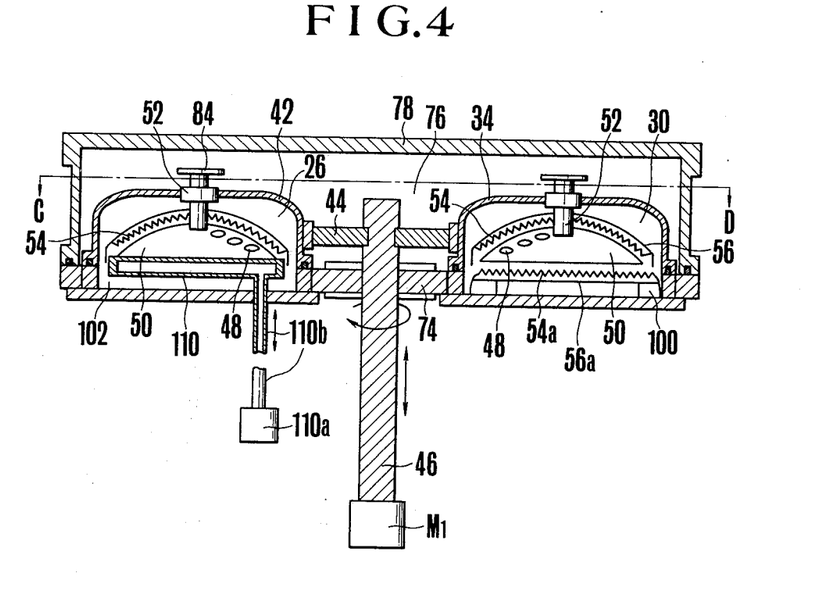
FIG. 4 is a vertical sectional view illustrating constructional features of the preheating and cooling chambers of FIGS. 2 and 3.

Referring to FIGS. 2 to 9, there is shown one embodiment of a vapor deposition apparatus according to the present invention adapted to apply three thin-film layers of different metals successively onto an optical or electric circuit element or magnetic substrate. In FIGS. 2, 3 and 4, the apparatus is shown including a vacuum container 76 formed by a round base plate 74 and a vacuum vessel 78, the latter being sealed on the base plate 74 by an annular rubber gasket 86. The vacuum container 76 accommodates six movable sealing hollow covers or bell jars 32, 34, 36, 38, 40 and 42 supported by respective rods 44 radially extending from a drive shaft 46 which protrudes through the base plate 74 at almost the center of the area thereof and which is operatively connected to the output shaft of an electric motor M1 in a manner to allow for rotative and vertical movements of the shaft 46. The bell jars 32 to 42 each have a flange or sealing rim extending outwardly of the sides thereof at its open end and having an annular groove formed in the front surface of the flange to hold a resilient sealing ring 88 therein. With the bell jars 32 to 42 of such construction when placed to cover respective circular openings provided through the wall of the base plate 74, one entrance-and-exit air locking chamber, one preheating chamber, three vapor depositing chambers, and one cooling chamber are established in an entirely isolated manner from the controlled atmosphere 76, as the interior spaces of the chambers are each comprised of an upper section in the bell jars and a lower section 64, 100, 58-1, 58-2, 58-3 or 102 respectively.

The entrance-and-exit air locking chamber is formed by a cylindrical side wall 65 air-tightly mounted on the lower surface of the base plate 74 and a bottom cover 98 which may be sealed to the cylindrical side wall 65 by an annular packing 94 and which when moved away from the side wall 65, the resultant opening enables a batch of substrates 48 on a dome shaped carrier 50 to enter the interior 64 of the chamber from the outside of the apparatus and vice versa. A shaft 68 which is air-tightly and movably fitted in a hole formed in the bottom cover 98 at the center of the area thereof supports a pedestal 66 on which a dome 50 is situated to be transferred and is driven for vertical movement by driving means 68a. The cylindrical side wall 65 has a conduit 104 which is separated into two sections one of which is connected to a source of controlled atmosphere, a vacuum source or rotary vacuum pump R.P., through a valve 106, and the other of which is connected through a valve 108 to open to the ambient atmosphere. In order to insure a retention of a vacuum within the container 76 when air is introduced into the chamber 64, there is provided a pressing device comprising an oil hydraulic means 70 and a pair of arms 72 arranged upon operation of the hydraulic means 70 to press the bell jar against the base plate 74.

The vapor depositing chambers 58-1, 58-2 and 58-3, taking one 58-2 as an example, are formed by a cylindrical side wall 75 and a bottom cover 58-2a which latter is normally sealed to the side wall 75 by an annular resilient packing 94 and which can be opened by means 59 when the operator wants to clean up the interior of the chamber 58-2. Inside the chamber, there are an evaporant source with a heater 60, a shutter device 62 for controlling the evaporation of evaporant, and an evaporant material feeding mechanism 58-2b which latter will be described in greater detail later. Outside the chamber 58-2, there are an atmosphere control gas source P' such as oxygen and nitrogen connected through a gas flow adjusting valve 106 to the interior of the chamber, a vacuum source comprising a rotary pump R.P. and a diffusion pump D.P. are connected in series to each other and to a conduit 104 of the side wall 75 through respective intervening pressure adjusting valves 106, the conduit 104 being also connected directly to the rotary pump R.P. through a pressure adjusting valve 106 and to open to the ambient atmosphere through a valve 108. In addition shutter control means 62a and 62b are provided, and drive means 59 are affored for the bottom cover 58-2a.

In FIG. 4, there are shown the pre-heating chamber 100 and the cooling chamber 102, in which heating means and cooling means are contained, respectively. The heating means is constructed from a heater 54a and a radient energy reflector 56a. The cooling means is constructed in the form of a hollow plate 110 having a cold water conduit 110b air-tightly and movably fitted in a hole provided through the bottom cover. The conduit 110b also serves to control the position of the plate 110 relative to the dome 50 with the help of a drive means 110a so that the speed of cooling of the processed substrates 48 can be adjusted to a desired value.

Figure 5:
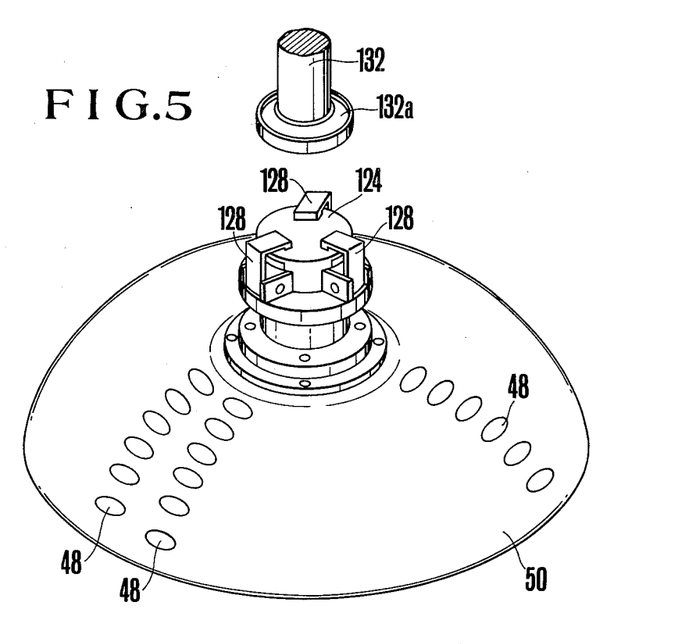
FIG. 5 is a perspective view of a substrate carrier of dome shape with a cramping device.
Figure 6:
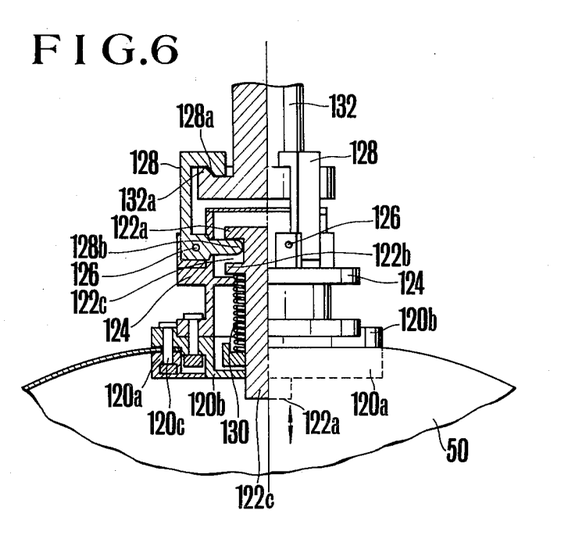
FIG. 6 is a partly elevational and partly sectional view illustrating the details of the crampling device of FIG. 5 in an operative position where the carrier is suspended from the top of the bell jar.

In FIGS. 5 and 6, there is shown a mechanism for removably suspending a substrate carrier or dome 50 from the top of the interior of the sealing hollow cover at a flange 132a of a rod 132 fixed on the inward top portion 521 of each bell jar. The mechanism includes inside and outside guard plates 120a and 120b sandwiching the wall of the dome 50 at the pole or vertex thereof and secured in fixed relation thereto by screws 120c, and a collet 124 fixedly mounted on the outside guard plate 120b. The collet 124 has a radial flange extending outward from the sides thereof at an intermediate point of the longitudinal length on which three cramps 128 are pivotally mounted in separation from each other by an angular distance of 120°. An operating member or shaft 122 protrudes through the inside and outside guard plates 120 into a space within the collet 124 and has two upper flanges 122a and 122b radially extending outwardly of the sides thereof at its top end and an intermediate point respectively with a space therebetween receiving lugs 128b of the cramps 128, so that after the dome 50 is transferred from the lower section 64 of the entrance-and-exit air locking chamber to the upper section 28 thereof, namely, the interior of the cap 32 by the fixed combination of the pedestal 66 and the shaft 68, when the shaft 68 is retracted while the pedestal 66 remains stationary, the shaft 122 is driven for downward movement by the action of an expansion spring 130 between an inwardly extending flange of the collet 124 and a third flange 122c of the shaft 122, thereby all the cramps 128 are turned at one time inwardly to their positions illustrated in FIG. 6 by the first flange 122a engaging the lugs 128b of the cramps 128. When the shaft 122 is pushed upward, all the cramps 128 are turned about their pivot pins 126 outwardly in engagement at the lugs 128b with the second flange 122b of the shaft 122, thereby the pawls 128a are moved away from the flange 132a of the suspension rod 132.

Figure 7:
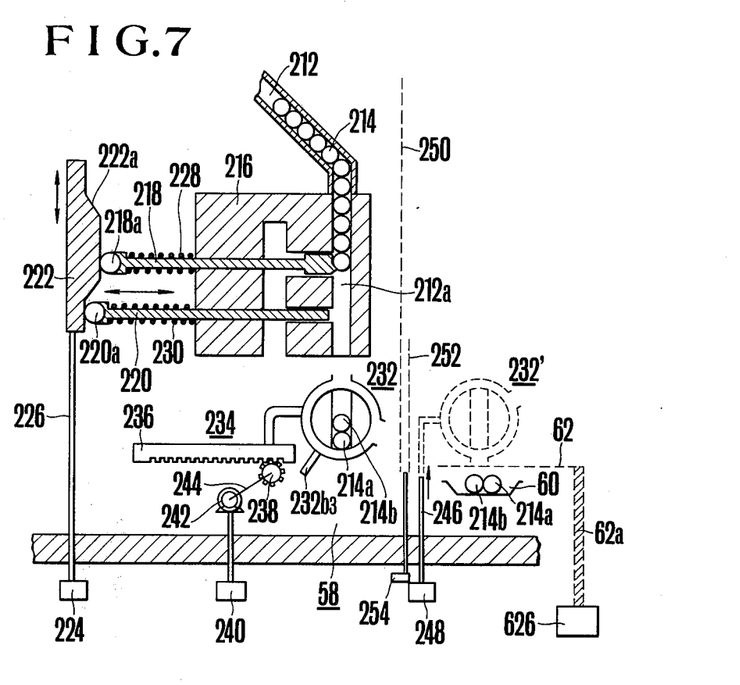
FIG. 7 is a sectional view of an example of an evaporant material feeding mechanism of the present invention usable in the apparatus of FIGS. 2 to 6.
Figure 8:
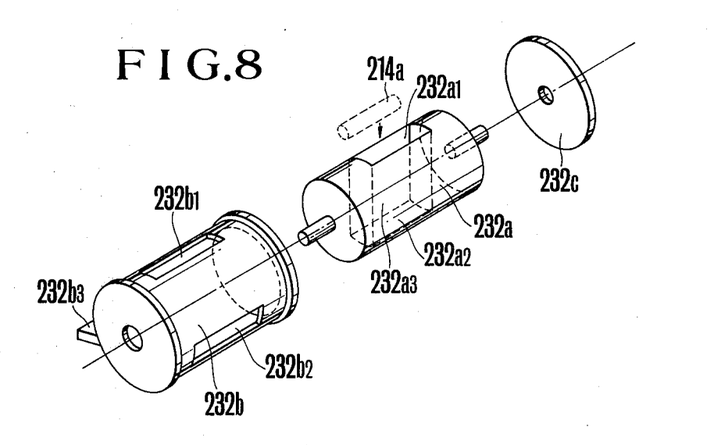
FIG. 8 is an exploded perspective view illustrating constructional feature of a transfer member of the mechanism of FIG. 7.
Figures 9A, 9B:
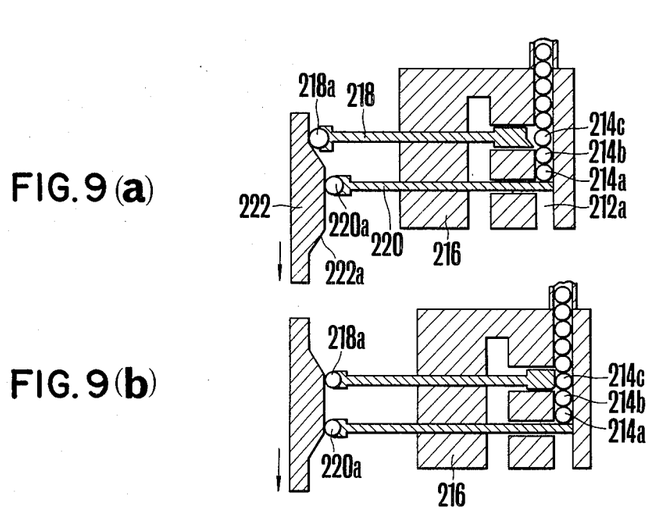
Figure 9C:
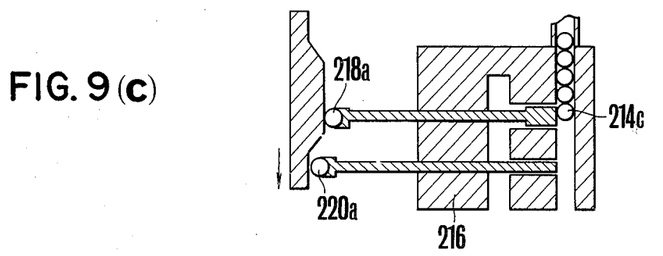
Figure 9D:
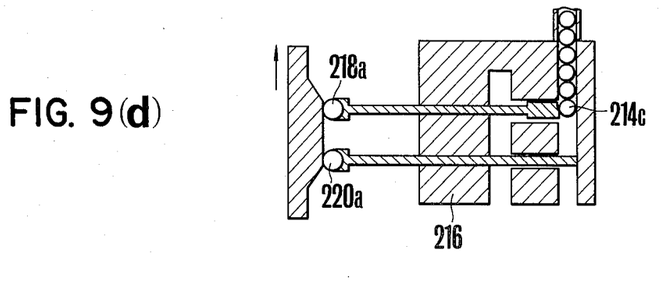

FIGS. 7 to 9 show an evaporant material feeding mechanism which insures that the amount of evaporant material supplied to an evaporation source is controlled so as to maintain the speed of formation of an evaporant at a constant level. For this purpose, the finely divided evaporant material is pelleted to small spheres or cylinders which are then fed to the evaporation source, or predetermined numbers at a time. In the example of FIGS. 7 to 9, the pellets of evaporant material such as silver, copper and gold which are cylindrical are previously stored in a reservior not shown within the vapor depositing chamber 58. In addition to the reservoir, the feeding mechanism further includes a pellet conduit 212 through which a row of pellets 214 are fed from the reservoir to a supply control block 216, a pair of control bars 218 and 220 passing through respective holes in the block 216 and arranged upon movement to the right to shut the pellet conduit at 212a, and a cam plate 222 having a camming surface 222a against which two rollers 218a and 220a on the opposite ends of the control bars 218 and 220 are pressed by expansion springs 228 and 230. With the cam plate 222 set in the lowest position illustrated in FIG. 9(a), the first bar 218 is retracted from the guide path of the pellet row, and the second bar 220 is fully projected to shut the guide path, whereby two cylindrical solid pellets 214a and 214b are caused to occupy a space between the axes of the bars 218 and 220, and a third pellet 214c counting from the bottom is in alignment with the first bar 218. When the cam plate 222 is moved upward by a rod 226 with a motor 224 to an intermediate position illustrated in FIG. 9(b), the third pellet 214c is prevented from downward movement by the first bar 218. Upon further upward movement of the cam plate 222, the cam lug 222a is moved away from the second cam follower or roller 220a, causing the second bar 220 to move to the left under the action of the spring 230, and therefore causing the two pellets 214a and 214b to drop into a transfer member 232 as shown in FIGS. 7 and 9(c).

Constructional features of the transfer member 232 are better understood from FIG. 8, where a receptor 232a for the pellets 214a and 214b is in the form of a cylinder having an entrance opening 232a1 of a larger area than that of the longitudinal cross-section of each pellet, and an exit opening 232a2 of the same area, the entrance and exit openings 232a1 and 232a2 being communicated to each other through a space 232a3. The cylinder 232 is fixedly mounted on the rack 236 (FIG. 7) at such a location that the vertically oriented space 232a3 is in alignment with the pellet guide path 212a in the block 216 when the rack 236 is in the leftest position illustrated in FIG. 7. An external sleeve 232b is rotatably mounted on the cylinder 232a and has two rectangular openings 232b1 and 232b2 of an area equal to or slightly larger than that of the openings 232a1 and 232a2 spaced from each other by such an angular distance that when the entrance openings 232a1 and 232b1 are vertically aligned to each other, the exit openings 232a2 and 232b2 are off-set to retain the pellets 214a and 214b in the space 232a2. A pinion 238 meshes with a toothed portion of the rack 236 and is driven for rotation by an electric motor 240 through a gear train 242 and 244. When the receptor 232 is moved to a position shown by dashed lines, an electric motor 248 is energized to drive a rod 246 for upward movement which in turn causes clockwise movement of the sleeve 232b in engagement with a projection 232b3 radially extending from the sleeve 232b until the exit opening 232b2 is brought into alignment with the exit opening 232a2, thereby the pellets 214a and 214b are thrown into the evaporation source 60. To prevent the evaporant from depositing on the various parts of the apparatus and particularly on the transfer member 232, there are provided first and second shutter means 250 and 62 respectively.

Figure 10:
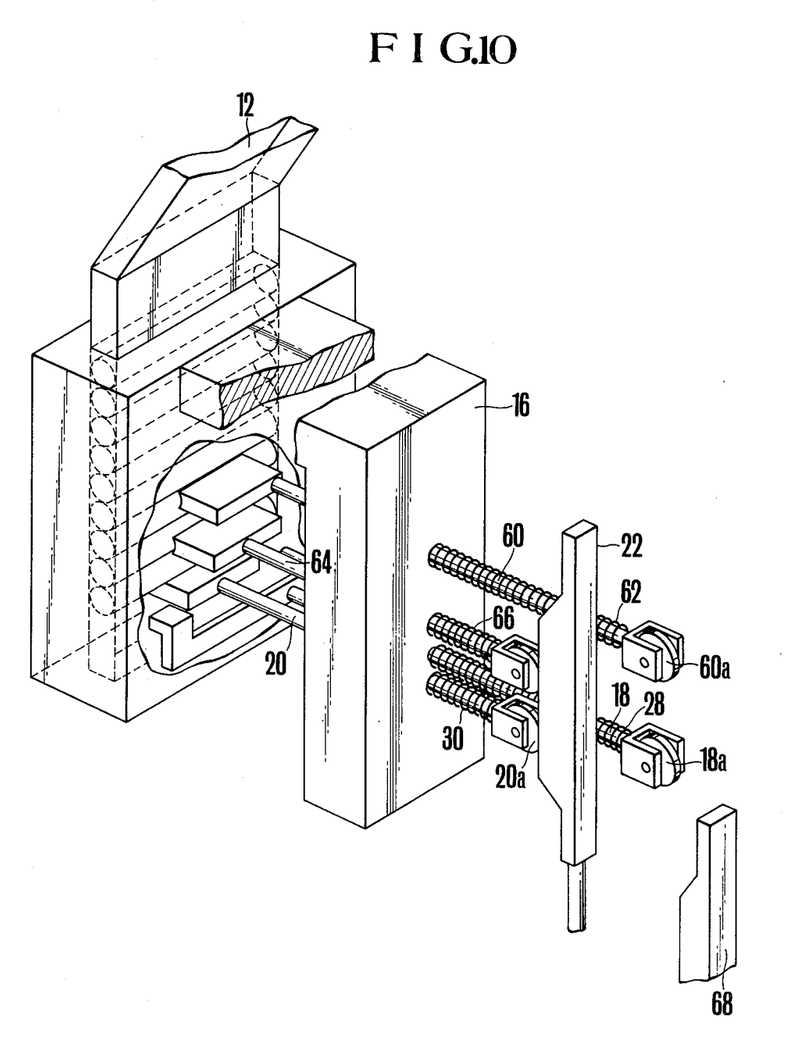
FIG. 10 is a perspective view of an example of the evaporant material supply control member.

FIG. 10 shows an example of variation of the supply control member of the feeding mechanism for the purpose of selectively controlling the number of pellets supplied to evaporation source in one cycle of operation of the cam plate 222. In addition to a first pair of control bars 18 and 60 spaced apart from each other by a distance equal to that of the bars 218 and 220 of FIG. 7, there is provided a second pair of control bars 20 and 64 spaced apart from each other by a distance corresponding to the diameter of one pellet so that the evaporation source 60 is supplied with pellets with selection of one or two at one time by selectively operating the corresponding one of cam plates 68 and 22 respectively.

The operation of the apparatus of FIGS. 2 to 9 will be explained by reference to a continuous process for applying a three-layer coating on an optical or electric circuit element such as resistors, condensers or electromagnetic substrate.

(a) Preparatory step: The container 76 and all the six chambers are evacuated by the respective vacuum pumps for a certain time.

(b) Dome loading step: The oil hydraulic device 70 is operated to press the bell jar 32 against the base plate 74. Then the valve 108 is opened to cause entrance of the embient atmosphere into the entrance-and-exit air locking chamber. Then, the bottom cover 98 is moved downward along with the shaft 68 to enable for the operator to put a first dome 50 on the pedestal 66. After the dome 50 is situated on the pedestal 66, the motor 68a is operated to lift the pedestal 66 and the bottom cover 98. With the bottom cover 98 sealed on the side wall 65 by the packing 94, upon further slightly upward movement of the shaft 68, the shaft 122 (FIG. 6) is pushed upward by the top end of the shaft 68, thereby the all cramps 128 are opened to receive the rod flange 132a. While the pedestal 66 is maintained stationary at this state, the shaft 68 is moved downward, causing the cramps 128 to be closed under the action of the spring 130. After that, the pedestal 66 also is moved downward to produce a clearance for movement of the bell jar 32 in the following step.

(c) Air locking step: After the valve 108 is again closed, the rotary pump R.P. is operated with the valve 106 open to evacuate the air locking chamber 64 to a pressure level almost equal to a vacuum in the container 76. Then a radient energy heater 54 above the dome 50 starts to operate.

(d) Pre-heating step: The hydraulic device 70 is rendered no longer effective to press the bell jar 32 against the base 74. Then the shaft 46 is moved upward slightly and rotated by the motor M1 to advance all the caps one step ahead, so that the bell jar 32 in which the first dome is suspended is used to establish a preheating chamber together with the space 48 (FIG. 4). Then the heater 54a is energized to further increase the temperature of the substrates 48, thereby the absorbed gas and volatile contaminates are driven off from the substrate surface, and the resultant substrate surface is suited for receiving a thin-film layer of evaporant material.

On the other hand, the step (b) is repeated to load a second dome 50 as suspended in the bell jar 42, since this bell jar 42 constitutes a new air locking chamber together with the unchanged lower section thereof. Step (b) is followed by step (c) for the second dome. After the bell jar 42 is released from the hydraulic device 70, the shaft 46 is again operated to advance all the bell jars one more step ahead with the resultant positions of the first and second domes 50 being in the first depositing chamber and the pre-heating chamber respectively. During this advancement, the surrounding atmosphere of the first dome 50 is left undisturbed because the leakage of the ambient atmosphere from the air-locking chamber into the container is limited to a very small level.

(e) First layer depositing step: The first vapor depositing chamber 58-1 is evacuated to a lower pressure level than that within the container 76. Then the evaporant material feeding mechanism is operated to feed pellets 214 to the evaporation source 60 at a rate dependent upon the speed of formation of an evaporant. During the vapor depositing operation, the dome 50 is rotated about its pole by drive means 80 (FIG. 2) to insure that the thicknesses of first layers on different substrates are almost the same. When the thickness of the first layer contiguous to the substrate 48 has reached a predetermined level as measured by a monitor not shown, the formation of the evaporant is stopped either by cutting off the electrical power supply to the evaporation source 60 or by making use of the shutter 62 closed. Whilst the first dome is treated in the first vapor depositing chamber, the second and third domes are treated in the pre-heating and air locking chambers respectively.

(f) Second layer depositing step: The first, second and third domes are transferred to the second and first depositing chambers and the preheating chamber respectively. During the simultaneous treatments of these three domes in manners similar to those described above, a fourth dome is loaded into the air locking chamber in a manner similar to that described in connection with steps (b) and (c). In the second depositing chamber, a second thin-film layer is deposited on the first layer.

(g) Third layer depositing step: The first, second, third and fourth domes are transferred to the third, second and first depositing chambers 58-3, 58-2 and 58-1 and the pre-heating chamber respectively, and a fifth dome is loaded in the air locking chamber. In the third depositing chamber 58-3, a third thin-film layer is deposited on the second layer.

(h) Cooling step: After the first dome is transferred to the cooling chamber 102, the cooling plate 110 is lifted up to contact with the lower edge of the dome 50. Thus, the heat energy of the substrate is transmitted through the dome body to the cooling plate 110. During this cooling operation, the second, third, fourth and fifth domes are subjected to the third layer, second layer and first layer depositing steps and the pre-heating step respectively and a sixth dome is loaded in the air locking chamber.

(i) Exit transferring step: After the temperature of the first dome is decreased to a predetermined value, and the treatments of the other domes are completed, all the bell jars are advanced to complete one cycle of round movement within the vacuum container 76 with the first dome in the air locking chamber. Then, the hydraulic device 70 is rendered effective to press the bell jar 42 against the base 74. Then the valve 108 is opened to increase the atmospheric pressure within the air locking chamber to about 760 mmHg. Then, the pedestal and shaft are moved upward to release the first dome from cramping engagement with the suspension rod 132. Then the first dome is transferred from the air locking chamber to the outside of the apparatus. After that, a seventh dome is loaded into the apparatus in a manner similar to that described in connection with steps (b) and (c).

It will be seen from the foregoing that the present invention provides a vapor deposition apparatus capable of continuous processing of batches of substrates through the pre-heating, vapor depositing and cooling chambers to insure that an improved uniformity of thin-film characteristics over the prior art is produced.

In summary, this invention has the following features and advantages:

(1) A number of batches of substrates are continuously processed through the respective chamber sections for pre-heating, vapor depositing and cooling operations independently controlled of each other in the same apparatus. Accordingly, there is no need to wait the removal of any one of the processed substrate batches until all the once loaded batches have completed one cycle of processing operation as in the conventional apparatus of the bell jar type. This leads to a remarkable increase in the efficiency of production run.

(2) Since the vapor depositing chamber is admitted of communicating a substrate transferring chamber, namely, the vacuum container whose atmosphere or vacuum is previously controlled to a desired pressure level, when the processing advances one step. The avoidance of repeated exposure to the ambient atmosphere of the vapor depositing chamber insures that a specific atmosphere can be attained in the vapor depositing chamber far sooner than in the prior art after the chamber starts to be evacuated, thereby it being made feasible to control the properties of the deposited thin-film layer produced by different depositing operations.

(3) In this type of vapor deposition apparatus well known in the art as the in-line type, the mechanism for transporting substrates to be processed must be operated in a vacuum with very severe limitation to the selection of a lubricant. As a result, this gives rise to the problems of frequent damages of the transporting mechanism, of decreasing the life-time of the apparatus due to the unavailability of a perfect lubricant, and of contamination of the controlled atmosphere by the vapor of the used lubricant. According to the present invention, the vapor depositing chamber is shielded from the substrate transporting chamber, and almost no use of a lubricant may be made to assure a satisfactory operation of the apparatus, thus solving the above-mentioned problems. This facilitates the achievement of minimization of the production cost and of improvement of the quality of the thin film applied on the surface of a substrate.

(4) To vary the chemical composition of the coating by introducing a gas such as oxygen and nitrogen into the vapor depositing chamber, it has been the prior art practice to completely exhaust the preceding controlled atmosphere before the next layer of different chemical composition is applied. This exhaustion requires a very long time compared with the effective deposition time. According to the present invention, the apparatus is provided with a number of separate vapor depositing chambers whose atmospheres can be controlled independently of each other to omit the atmosphere exchanging step which would be otherwise necessary when the conventional apparatus is employed.

(5) By the use of the principles of the present invention, it is made possible to design and manufacture the upper and lower sections of a vapor depositing chamber in respectively and independently optimized forms. Further, the entrance air locking chamber also serves as an exit air locking chamber. This round arrangement of the various intermediate chambers reduces the area of installation of the apparatus to a great extent as compared with the linear arrangement of the chambers including separate entrance and exit air locking chambers which arrangement has found wide use in the conventional apparatus.

(6) The number of vapor depositing chambers in the single apparatus may be varied depending upon the desired degree of multiplicity of the layers in the coating.

(7) The principles of the present invention are applicable to the various coating processes including cathode sputtering in either vacuum or special gas atmosphere without any loss in the effectiveness of the invention.

(8) Whilst the conventional in-line type apparatus necessitates many complicated control mechanisms for the sealing devices between the successive chamber sections, the substrate conveyor and the like, the apparatus of the present invention is characterized by simplified constructional features due to the employment of a fixed relation between the loaded substrates and the upper sections of the various chambers, thereby giving an advantage of reducing the possibility of occurrence of damages of the otherwise necessary complicated control mechanisms with increase in the speed of production run.

(9) The present invention has been described in connection with a typical example of a vapor depositing apparatus having a pre-heating chamber 100, vapor depositing chambers 58-1, 58-2 and 58-3 and a cooling chamber 102. In application to the alminium or silver coating of a reflection mirror for use in a camera, however, there is no need to use the pre-heating and cooling chambers. In this case, the design flexibility of the apparatus of the present invention becomes very valuable.

(10) To remove the cleaning difficulty of the conventional apparatus, according to the present invention, each of the chambers is constructed with a removably mounted bottom cover. Therefore, the interior surfaces of the depositing chamber can be maintained always free from the accumulation of deposited evaporant material and impurities which work as a trap of undesirable gas emanating from the substrate being processed. Accordingly, the problem of elongating the evacuation time due to the ejection of the trapped gas does not arise in the apparatus of the present invention.

Although the present invention has been described with reference to a certain preferred embodiment in detail, it is to be understood that other various changes, substitutions and alternations can be made therein without departing from the spirit and scope of the invention as defined by the appended claims.

What is claimed is:

1. A vacuum processing apparatus comprising:
   (a) a housing forming a main vacuum container;
   (b) a driving shaft;
   (c) vacuum chamber forming means for forming a plurality of independent vacuum chambers located within said main vacuum container, said vacuum chamber forming means comprising:
      (i) cover means located within said housing and being rotatively mounted on and controlled by said driving shaft for forming said independent vacuum chambers, said cover means at least being covered by a vacuum within said main vacuum container, and
      (ii) sealing means for keeping said independent vacuum chambers air tight;
   (d) hanger means for supporting articles to be processed within each of said independent vacuum chambers;
   (e) means forming an entrance-and-exit chamber having an inlet-and-outlet opening through which the articles to be processed are moved in and out of said housing, said entrance-and-exit chamber being one of said independent vacuum chambers;
   (f) inhaling-and evacuating means for evacuating said main vacuum container and the plurality of independent vacuum chambers for maintaining them at a predetermined pressure level; and
   (g) evaporant means for causing at least one evaporant material disposed in certain of said independent chambers to evaporate for effecting vacuum plating on the articles to be processed.

2. A vacuum processing apparatus comprising:
   (a) a housing forming a main vacuum container and including a container body member;
   (b) a driving shaft;
   (c) vaccum chamber forming means for forming a plurality of independent vacuum chambers within said main vacuum container, said vacuum chamber forming means comprising:
      (i) cover means located within said housing and being rotatively mounted on and controlled by said driving shaft for forming said plurality of independent vacuum chambers, said cover means located in said main vacuum container and forming in combination with container body member said independent vacuum chambers and being surrounded by a vacuum layer within said main main vacuum container, and
      (ii) sealing means for keeping said independent vacuum chambers air-tight;
   (d) means for supporting articles within said cover means, said means including means for hanging said articles to be processed within said cover means;
   (e) means forming an entrance-and-exit chamber having an inlet-and-outlet opening through which the articles to be processed are moved into and out of said housing, said chamber being one of said vacuum chambers;
   (f) heating means for heating the articles to be processed, said heating means being disposed in one of said plurality of independent vacuum chambers;
   (g) an inhaling-and-evacuating means for evacuating said main vacuum container and the plurality of independent vacuum chambers for maintaining them at a predetermined pressure level; and
   (h) pressure means for applying pressure on said cover means for overcoming the atmospheric pressure of the interior of said entrance-and-exit chamber when said articles enter or exit.

3. A vacuum processing apparatus comprising:
   (a) a housing forming a main vacuum container and including an upper cover, a base plate member and a wall portion extending from said base plate member;
   (b) a driving shaft;
   (c) a chamber forming means for forming a plurality of independent vacuum chambers within said housing, said chamber forming means being concentrically mounted on said driving shaft and including bell jar members mounted on said driving shaft, said chamber forming means in combination with said wall portion forming said plurality of independent chambers;
   (d) hanging means for holding articles to be processed within each of said bell jar members;
   (e) said independent vacuum chambers include an entrance-and-exit chamber having an inlet-and-outlet opening in a part of said wall portion forming said plurality of independent chambers, said opening arranged for moving in and out the articles to be processed;
   (f) heating means disposed within one of said chambers for heating the articles to be processed;
   (g) evaporant means for causing at least one evaporant material disposed in certain of said independently formed vacuum chambers for vacuum plating the articles to be processed;
   (h) an inhaling-and evacuating means for evacuating said main vacuum container and independent vacuum chambers to a predetermined pressure level; and
(i) pressure means for applying pressure on said bell jar member of said entrance-and-exit chamber for overcoming the atmospheric pressure of the interior of said entrance-and-exit chamber when the articles to be processed enter or exit.

4. A vacuum processing apparatus comprising:
(a) a vacuum housing including an upper cover, a base plate and a wall portion arranged to form, in combination with said base plate a plurality of housing compartments independent of one another, each of said compartments being provided with an opening;
(b) an upwardly arranged driving shaft positioned approximately in the middle part of said vacuum housing for executing rotative and up-and-down motions;
(c) means for driving said driving shaft;
(d) cover means for each opening of said housing compartments for forming an independent vacuum chamber, said cover means being mounted on said driving shaft for rotative and up-and-down motions therewith;
(e) sealing means for maintaining each of said housing compartments airtight;
(f) entrance-and-exit means for providing one of said housing compartments with an inlet-and-outlet opening in the bottom part thereof for bringing articles to be processed into and out of the compartment;
(g) a heater arranged in one of said housing compartments to heat said articles to be processed;
(h) evaporant means including means for supplying at least one evaporant material to certain of said housing compartments and at least one heater for evaporating said at least one evaporant material;
(i) means for hanging the articles to be processed within each of said vacuum chambers, said hanging means including a dome for supporting the articles to be processed thereon and a hanger for depending said dome from said cover means;
(j) inhaling-and-evacuating means for evacuating said independent vacuum chambers and said vacuum housing means to a predetermined pressure level and for evacuating said vacuum chamber having said entrance-and-exit means connected thereto for introducing thereto an ambient atmosphere;
(k) a pressure means for applying a pressure on the top of said cover means of said vacuum chamber having said entrance-and-exit means connected thereto for overcoming the atmospheric pressure of the interior of said chamber when one said dome enters and exits; and
(l) cooling means including a cooling plate arranged within one of said independent vacuum chambers for cooling the articles to be processed.

5. A vacuum processing apparatus according to claims 1, 2, 3 or 4, further including:
(a) cramping means for cramping said hanging means on which the substrates to be processed are positioned.

6. A vacuum processing apparatus according to claims 1, 2, 3, or 4, further including:
(a) preheating means including a heater, and said preheating means located in each of said vacuum chambers.

7. A vacuum processing apparatus according to claims 1, 2, 3 or 4, further including:
(a) means for rotating said substrates, said rotating means including a drive means and transmission means for transmitting a rotary force from said drive means to said hanger means.

8. A vacuum processing apparatus according to claims 1, 2, 3 or 4, further including:
(a) lifting means for opening and closing an end portion of said entrance and exit chamber for admitting and removing said substrates.

9. A vacuum processing apparatus according to claims 1, 2, 3 or 4, further including:
(a) an evaporant material feeding device having a transfer member for transferring an evaporant material supplied from a reservoir to said vacuum chamber having said evaporant means.

10. A vacuum processing apparatus according to claim 9, further including:
(a) shutter means for controlling the evaporation of evaporant; and
(b) shutter control means for controlling said shutter means.

11. A vacuum processing apparatus according to claims 1, 2, or 3, further including:
(a) cooling means for the articles being processed including at least one cooling plate arranged in certain of said plurality of vacuum chambers and being arranged to cool the articles being processed with a cooling medium supplied from outside of said chambers.

12. A vacuum processing apparatus according to claim 11, further comprising:
(a) drive means for adjusting the height of said at least one cooling plate disposed within said vacuum chamber for adjusting the speed at which the articles being processed are cooled.

13. A vacuum processing apparatus according to claim 10, further including:
(a) means forming a supply path for supplying at least one evaporant material to the inside of said vacuum chambers containing said evaporant means;
(b) control means for controlling the amount of said evaporant material supplied through said supply path;
(c) receiving means for receiving the evaporant material supply-controlled by said control means at the opening of said supply path; and
(d) transporting means for transporting said receiving means to a predetermined location.

14. A vacuum processing apparatus according to claim 13, further including:
(a) a shield for preventing the vaporized evaporant material from depositing on said evaporant material feeding device.

15. A vacuum processing apparatus according to claim 13, wherein said receiving means comprises:
(a) a container member for containing the evaporant material supplied;
(b) an outer barrel member in which said container member is rotatably mounted, and having a first opening coincident with an entrance opening of said container member, and a second opening located at an arbitrary point within an angle of less than 180° from said first opening; and
(c) means for bringing an exit opening of said container member and said second opening of said outside barrel member into coincidence with each other.

* * * * *